Dec. 8, 1959 J. L. HESS, JR 2,916,718

SOCKET SUPPORT

Filed Jan. 25, 1956

WITNESSES:

John J. Callahan

Bernard R. Giegucz

INVENTOR

James L. Hess, Jr.

BY F. E. Browder

ATTORNEY

United States Patent Office 2,916,718

Patented Dec. 8, 1959

2,916,718

SOCKET SUPPORT

James L. Hess, Jr., Metuchen, N.J., assignor to Westinghouse Electric Corporation, East Pittsburgh, Pa., a corporation of Pennsylvania Application January 25, 1956, Serial No. 561,272

6 Claims. (Cl. 339—17)

This invention relates to supports for socket devices and particularly to a support for socket devices especially adapted for use with printed electronic circuits.

An electronic circuit is considered as being printed when it is produced on an insulating surface or panel. The panel may comprise a plastic or a laminated plastic material. The types of plastic laminates are many, since a wide variety of resins may be used with an equally wide variety of binders. Phenolics, melamine, epoxides, polyesters, silicones and Teflon are the usual resins or family of resins used in constructing the panel. The panel is relatively flexible due to the nature of the material of which it is constructed. Heretofore, difficulties have been encountered in using socket devices in connection with such a panel. The stresses developed by insertion and extraction of electron tube prongs into and out of the socket devices, particularly adjacent to where they are mounted on the panel, are likely to cause the panels to crack and destroy the printed circuit. This effect is increased when a plurality of socket devices are mounted in an efficient arrangement along the center line of the printed circuit panel. Also, as more and more circuitry is included on the panel resulting in increased size, there is an even greater tendency for the panel to crack due to the weight of the added components. In addition, when a conductive material is deposited on only one side of the panel there is the likelihood that the panel will flex excessively or bow and thus the printed circuit will be destroyed.

This invention provides a support for a socket device which spans a plurality of socket devices on the bottom side of a printed circuit panel. In a preferred embodiment, the socket support has a projecting portion which is inserted into the center ground shield of each socket. The entire assembly is then dip soldered and all of the center shields are soldered to the socket support with a good mechanical and electrical bond. A particular socket is then supported by the socket support by means of mutual support from the other sockets.

A feature of this invention is that the socket support also serves as part of the circuitry by interconnecting grounds for various components, thus eliminating the need for some of the printed circuit connections which would otherwise be necessary.

It is, therefore, an object of this invention to provide means for supporting socket devices in a printed circuit.

It is another object to provide a means for supporting a plurality of socket devices which are mounted on a relatively flexible printed circuit panel.

It is another object to provide means for preventing the insertion and extraction of units in a printed circuit from placing any stress upon the printed circuit.

It is another object to provide means for preventing a printed circuit panel from losing its desired shape.

It is another object to provide a support for a plurality of tube sockets in a printed circuit, which support is mechanically and electrically connected to the ground connections or terminals of the tube sockets.

It is a further object to provide a novel supporting structure for so-called "printed circuit" panels which structure includes an elongated member spaced from the panel with portions therealong being secured in fixed spaced positions relative to the panel so that the panel is thereby stabilized against lateral deflection.

These and other objects are effected by the invention, as will be apparent from the following description taken in accordance with the accompanying drawing throughout which like reference characters indicate like parts, and in which.

Figure 1:
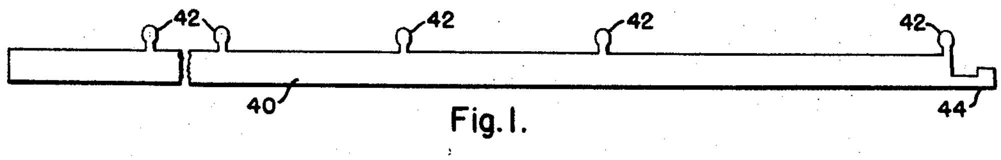
Figure 1 is a side elevational view of the socket support.

Referring in detail to the drawing, 10 indicates a relatively flexible printed circuit panel having apertures along the center line thereof for receiving a plurality of electron tube socket devices 12 through 17.

Figure 2:
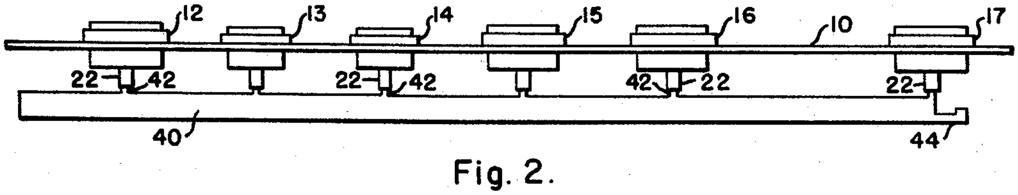
Fig. 2 is a side elevational view of the socket support showing the manner in which it is connected to a plurality of socket devices which are mounted on a printed circuit panel.
Figure 3:
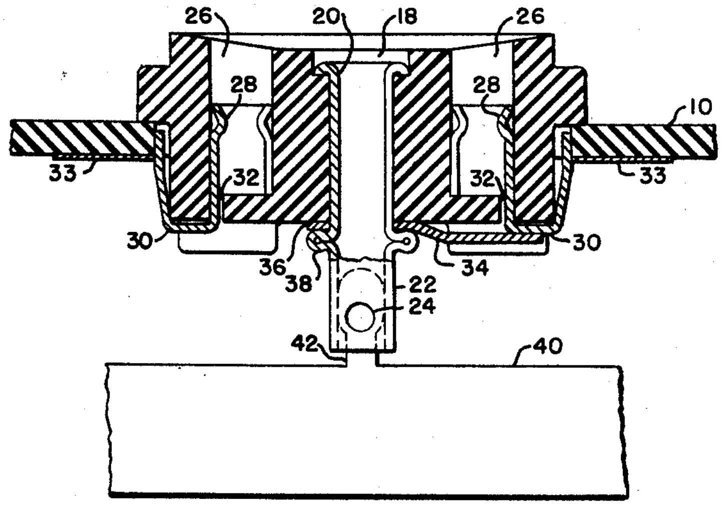
Fig. 3 is a fragmentary view of Fig. 2 showing in detail a construction for the socket devices which is helpful in describing the invention.

A common and preferred construction for the socket devices 12 through 17 with which the invention is especially suitable is shown in Figs. 2 and 3. Each of the socket devices is provided with a centrally disposed circular aperture 18 within which is located a center ground shield 20. The shield 20 is a rigid structure and has a portion 22 which extends downward a sufficient distance away from the lower side of the socket device to serve as a terminal to permit a ground attachment to be connected thereto. The shield 20 is split along one side, and at its lower end there are provided two openings, such as the one at 24, which are in registry with each other.

Each of the socket devices has holes 26 for receiving the base prongs of a vacuum tube. At the bottom of the prong receiving holes 26 are prong engaging terminals 28 having integral strips 30 projecting through slots 32 provided in the lower surface of the device and then extending upward to engage the panel 10. The upward extensions of the strips 30 serve as spring fingers to securely mount the socket device in the aperture of the printed circuit panel 10. The upward extensions of the strips 30 also make contact with portions of a printed circuit 33 which is mounted on the lower surface of the panel 10. A suitable prong engaging terminal 28 is electrically connected to the center ground shield 20 by means including a connecting member 34. The connecting member 34 has an annular portion 36 which is positioned around the shield 20. The connecting member 34 is held in place adjacent the lower surface of the socket device by means of a portion 38 on the center ground shield which is made larger in diameter than the inner diameter of the annular portion 36 once the latter portion is positioned around the shield.

The socket support member is shown in Fig. 1. It comprises a rigid metallic member 40 having a plurality of portions 42 projecting therefrom. The portions 42 are dimensioned so that they may be accommodated within the lower end of the shields 20. The portions 42 are also shaped so that shields 20 may be clinched to temporarily secure the socket support to them. The portions 22 of the shields are then soldered to the projecting portions 42. The holes 24 in the shields 20 allow solder to reach the projections 42 and insure that a good electrical and mechanical bond exists between the shields 20 and the socket support 40. The member 40 is irregularly shaped at one end 44 so that a wire can be wrapped and soldered to the member 40 for desired electrical connections.

From the above description it will be apparent that the present invention provides a highly effective and inexpensive socket support for a printed circuit.

While I have illustrated and described my invention in a preferred embodiment, it will be obvious to those skilled in the art that it is not so limited, but is susceptible of various other changes and modifications without departing from the spirit and scope thereof.

I claim as my invention:

1. In combination, a panel on which a printed circuit is formed and to which electrical connections from pronged units are to be made, said panel containing a plurality of socket devices for making electrical connections between the printed circuit and the prongs, each of said socket devices having a rigid ground terminal depending therefrom, and an elongated rigid support member spaced from and substantially parallel to said panel, said support member having a plurality of rigid projecting portions extending toward said panel at spaced points therealong, with each of said projecting portions being individually secured to the ground terminal of a socket device so as to prevent flexing of said panel relative to said support member.

2. In combination, a flexible panel on which a printed circuit is formed and to which electrical connections from pronged units are to be made, said panel having a plurality of spaced openings therethrough to accommodate socket devices for making electrical connections between the printed circuit and the prongs, each of said socket devices having a rigid ground terminal depending therefrom, and a rigid conducting support member spaced from and substantially parallel to said panel, said support member having a plurality of rigid conducting projections integral therewith and extending toward said panel at spaced points therealong, with each of said projections being individually secured to the ground terminal of a socket device in a manner such that said member supports said panel against lateral deflection.

3. In combination, a flexible panel on which a printed circuit is formed and to which electrical connections from pronged units are to be made, said panel having a plurality of spaced openings therethrough to accommodate socket devices for making electrical connections between the printed circuit and the prongs, each of said socket devices having a center ground shield depending therefrom, and a rigid conducting support member spaced from said panel, said support member having a plurality of rigid conducting projections integral therewith and extending toward said panel at spaced points therealong, with each of said projections being individually secured to the center ground shield of a socket device so that said sockets and said panel are fixed in position against deflection toward and away from said support member.

4. In combination, a flexible panel on which a printed circuit is formed and to which electrical connections from pronged units are to be made, said panel containing a plurality of socket devices for making electrical connections between the printed circuit and the prongs, each of said socket devices having a ground terminal depending therefrom, and an elongated and rigid metallic member spaced from and substantially parallel to said panel, said member having a plurality of rigid metallic projecting portions integral therewith and extending toward said panel, with each of said projecting portions being individually secured to the ground terminal of a socket device, and with each of said socket devices being secured to said panel so that said sockets and said member form a structure for stabilizing said panel against lateral deflection.

5. In combination, a flexible panel on which a printed circuit is formed and to which electrical connections from pronged units are to be made, said panel having a plurality of spaced openings therethrough centrally provided along the length thereof to accommodate socket devices for making electrical connections between the printed circuit and the prongs, each of said socket devices having a rigid ground terminal extending perpendicularly outward from said panel, and a rigid conducting support member spaced from said panel and extending between and mechanically secured to the outer ends of said ground terminals so that said member and said sockets form a bracing structure to stabilize said panel against lateral deflection.

6. In combination, a panel on which a printed circuit is formed and to which electrical connections from pronged units are to be made, said panel containing a plurality of socket devices for making electrical connections between the printed circuit and the prongs, each of said socket devices being secured to said panel and having a rigid ground terminal extending outward therefrom, and a rigid conducting support member having a plurality of rigid conducting projecting portions integral therewith, with each of said projecting portions extending toward said panel and being individually secured to the ground terminal of a socket device so that said support member and said socket devices form a bracing structure to prevent lateral flexing of said panel.

References Cited in the file of this patent

UNITED STATES PATENTS

| | | |
|---|---|---|
| 2,312,181 | Matthews | Feb. 23, 1943 |
| 2,468,737 | Davis | May 3, 1949 |
| 2,776,415 | McGinley | Jan. 1, 1957 |